US006803309B2

(12) United States Patent
Chou et al.

(10) Patent No.: US 6,803,309 B2
(45) Date of Patent: Oct. 12, 2004

(54) METHOD FOR DEPOSITING AN ADHESION/BARRIER LAYER TO IMPROVE ADHESION AND CONTACT RESISTANCE

(75) Inventors: Shih-Wei Chou, Taipei (TW); Chii-Ming Wu, Taipei (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 39 days.

(21) Appl. No.: 10/190,140

(22) Filed: Jul. 3, 2002

(65) Prior Publication Data

US 2004/0005775 A1 Jan. 8, 2004

(51) Int. Cl.[7] .............................................. H01L 21/44
(52) U.S. Cl. ............................ 438/653; 438/9; 438/44; 438/245; 438/485; 438/513; 438/648; 438/709; 438/710; 438/792; 438/798; 427/533; 427/534; 427/535; 134/1.1; 134/1.3; 219/121.36
(58) Field of Search ............................... 438/9, 21, 466, 438/485, 513, 709–710, 792–798, 642–648, 654–656, 660, 653, 689–692, 694–704, 724, 733–744, 42–44, 245; 427/450, 488, 533–535; 134/1.1–1.3; 219/121.36; 156/345

(56) References Cited

U.S. PATENT DOCUMENTS

| | | | | |
|---|---|---|---|---|
| 4,310,380 A | * | 1/1982 | Flamm et al. ............... 156/643 |
| 5,296,258 A | * | 3/1994 | Tay et al. ...................... 427/96 |
| 5,705,826 A | | 1/1998 | Aratani et al. |
| 5,968,279 A | * | 10/1999 | MacLeish et al. ........... 134/1.2 |
| 6,005,279 A | * | 12/1999 | Luning ......................... 257/510 |
| 6,110,836 A | * | 8/2000 | Cohen et al. ................ 438/710 |
| 6,136,163 A | * | 10/2000 | Cheung et al. .............. 204/198 |
| 6,149,828 A | * | 11/2000 | Vaartstra ....................... 216/57 |
| 6,200,895 B1 | * | 3/2001 | Givens et al. ............... 438/688 |
| 6,426,558 B1 | * | 7/2002 | Chapple-Sokol et al. ... 257/758 |
| 6,458,251 B1 | * | 10/2002 | Sundarrajan et al. .. 204/192.12 |
| 6,491,978 B1 | * | 12/2002 | Kalyanam ............ 427/255.394 |
| 6,548,374 B2 | * | 4/2003 | Chung ......................... 438/424 |

(List continued on next page.)

FOREIGN PATENT DOCUMENTS

| | | |
|---|---|---|
| DE | 198 51 703 | 5/2000 |
| EP | 0 786 820 | 7/1997 |
| WO | WO 99/39373 | 8/1999 |

OTHER PUBLICATIONS

J. A. Rogers et al., "Printing Process Suitable for Reel-to-Reel Production of High-Performance Organic Transistors and Circuits", Advanced Materials, VCH VERLAGSGESELLSCHAFT, WEINHEIM, DE, vol. 11, No. 9, Jul. 5, 1999, pp 741–745.

(List continued on next page.)

Primary Examiner—Matthew Smith
Assistant Examiner—Granvill D. Lee, Jr.
(74) Attorney, Agent, or Firm—Tung & Associates

(57) ABSTRACT

A method for forming an adhesion/barrier liner with reduced fluorine contamination to improve adhesion and a specific contact resistance of metal interconnects including providing a semiconductor wafer having a process surface including an etched opening extending through a dielectric insulating layer thickness and in closed communication with a conductive underlayer surface; preheating the semiconductor wafer in a plasma reactor to a pre-heating temperature of at least about 400° C.; cleaning the etched opening according to a plasma assisted reactive pre-cleaning process (RPC) comprising nitrogen trifluoride ($NF_3$); and, blanket depositing at least a first adhesion/barrier layer over the etched opening substantially free of fluorine containing residue.

17 Claims, 1 Drawing Sheet

U.S. PATENT DOCUMENTS

| | | | |
|---|---|---|---|
| 6,593,244 B1 * | 7/2003 | Wang et al. | 438/706 |
| 6,666,986 B1 * | 12/2003 | Vaartstra | 252/79.1 |
| 2001/0005629 A1 * | 6/2001 | Singhvi et al. | 438/653 |
| 2002/0003126 A1 * | 1/2002 | Kumar et al. | 216/67 |
| 2003/0000844 A1 * | 1/2003 | Carl et al. | 205/183 |
| 2003/0073304 A1 * | 4/2003 | Mak et al. | 438/643 |

OTHER PUBLICATIONS

F. Garnier et al., "All–Polymer Field–Effect Transistor Realized by Printing Techniques", Science, American Association for the Advancement of Science, US, vol. 265, Sep. 16, 1994, pp 1684–1686.

Z. Bao et al, "High–Performance Plastic Transistiors Fabricated by Printing Techniques", Chem. Mater. vol. 9, No. 6, 1997, pp 1299–1301.

C.J. Drury et al., "Low–cost all–polymer integrated circuits", Applied Physics Letters, vol. 73, No. 1, Jul. 6, 1998, pp 108–110.

M. Angelopoulos et al., "In–Situ Radiation Induced Doping", Mol. Cryst. Liq. Cryst. 1990, vol. 189, pp. 221–225.

* cited by examiner

METHOD FOR DEPOSITING AN ADHESION/BARRIER LAYER TO IMPROVE ADHESION AND CONTACT RESISTANCE

FIELD OF THE INVENTION

This invention generally relates to diffusion barrier layers and more particularly to a method for depositing an adhesion/barrier layer to improve contact resistances in semiconductor features.

BACKGROUND OF THE INVENTION

The escalating requirements for high density and performance associated with ultra large scale integration semiconductor wiring require increasingly sophisticated interconnection technology. As device sizes decrease it has been increasingly difficult to provide interconnection technology that satisfies the requirements of low RC (resistance capacitance) metal interconnect properties, particularly wherein submicron via/contact holes (inter-layer interconnects) and intra-layer interconnects with increasingly high aspect ratios.

In the fabrication of semiconductor devices, increased device density requires multiple layers, making necessary the provision a multi-layered interconnect structure. Such a multi-layered interconnect structure typically includes intra-layer conductive interconnects (wiring) and inter-layer conductive interconnects formed by openings or holes in an insulating layer (inter-metal dielectric layer). Such holes are commonly referred to as contact holes, i.e., when the hole extends through an insulating layer to an active device area, or vias, i.e., when the hole extends through an insulating layer between two conductive layers. The interface of the metal-metal contact is important since a poor contact will result in higher resistance thereby increasing current heating effects and slowing signal transport times.

In a typical process for forming multiple layer interconnect structures, such as for example, a damascene process, an insulating inter-metal dielectric (IMD) layer is deposited on a conductive layer, an opening is then anisotropically etched through the IMD by conventional photolithographic and etching techniques, followed by filling the opening with a metal such as tungsten, aluminum or copper. Excess metal remaining on the surface of the IMD layer may then be removed by a dry etchback process, for example, in the case tungsten metal is used, or a chemical-mechanical polishing (CMP), for example, in the case copper metal is used. One such method known as a dual damascene technique includes the formation of a via opening in communication with an overlying trench line to form a contiguous dual damascene where both such openings are subsequently simultaneously filled with metal to form a conductive inter-layer electrical contact (via) in communication with an intra-layer conductive line (trench line).

Signal transport speed is of great concern in the semiconductor processing art for obvious performance reasons. The signal transport speed of semiconductor circuitry varies inversely with the resistance and capacitance (RC) of the interconnections. As integrated circuits become more complex and feature sizes decrease, the effect of an RC delay becomes greater.

One way to increase the signal speed of semiconductor circuitry is to reduce the resistance of conductive interconnects. Aluminum (Al) has been conventionally used for forming conductive interconnects because it is relatively inexpensive, exhibits low resistivity and is relatively easy to etch. However, as the size of openings for vias/contacts and trenches is scaled down to the submicron range, step coverage problems have arisen with the use of Al, decreasing the reliability of interconnections formed between different wiring layers. Decreased step coverage results in high current density and enhanced electromigration.

Copper (Cu) and copper alloys have been favorably considered for replacing Al and W in VLSI interconnect metallizations. Cu has a lower resistivity than Al, making Cu attractive for intra-layer interconnection wiring. In addition, Cu has improved electrical properties compared to W, making Cu additionally attractive for use as a conductive plug for inter-layer interconnections.

There are, however, some disadvantages with the use of Cu or Cu alloys. For example, Cu readily diffuses through silicon dioxide, a typical inter-metal dielectric (IMD) material, and into silicon elements, adversely affecting the electrical properties thereof. For example, Cu is a deep-level dopant in silicon which acts to lower the semiconductor minority lifetime and increases junction leakage current. Another problem is that Cu exhibits poor adhesion to silicon dioxide based IMD layers. The problem is exacerbated as low-k porous materials where both diffusion of copper and poor adhesion is enhanced. One solution to this problem has been to form barrier/adhesion liners to line the anisotropically etched semiconductor feature prior to depositing the metal filling. Titanium nitride is commonly used as an adhesion/barrier layer since it is thermodynamically stable and is relatively impermeable to diffusing atoms and improves the adhesion of metal plugs, for example Cu or tungsten (W). A layer of titanium is frequently first deposited over the underlying material layer, frequently conductive areas of metal or silicon to improve (lower) the specific electrical contact resistance.

Tungsten is still preferred for use in the lower metallization layers adjacent to the silicon substrate since it provides an effective diffusion barrier to metal diffusion from overlying metallization layers to react with the silicon substrate. Tungsten further has high resistance to electromigration and can effectively be used to fill high aspect ratio vias by chemical vapor deposition (CVD) processes. In the use of Ti/TiN adhesion/barrier layers in tungsten filled damascenes the TiN nitride layer further operates to protect the Ti layer from reaction with tungsten CVD precursors such as $WF_6$ which typically causes 'volcano' defects.

One recurring problem with forming vias is the contact resistance of the metal filled via with the underlying landing layer, for example, silicon or metal. For example, residual contamination including organic residuals, for example fluoropolymers and native oxide formation over the underlying landing layer act to increase specific contact resistances. Various pre-cleaning approaches have been proposed to eliminate the problem of high contact resistivity including various forms of plasma pre-cleaning, often referred to as reactive pre-cleaning. One reactive pre-cleaning method that has been previously proposed for cleaning process in connection with silicided titanium layers has included fluorine containing gases.

It has been found that methods of reactive pre-cleaning in the prior art have resulted in decreased adhesion between a titanium containing layer and an underlying landing layer, for example silicon or metal. For example, frequently, during subsequent processes following filling of the via or damascene with metal including CMP processes it has been found that induced stresses have caused titanium containing layers to separate from the underlying landing layer. As a result, an electrically discontinuous pathway, often referred to as an Rc open, is formed thereby often requiring scrapping of the device, the presence of an Rc open otherwise known as a 'killer defect'.

There is therefore a need in the semiconductor processing art to develop a reactive pre-cleaning process whereby adhesion/barrier may be reliably deposited including retaining an adhesion to an underlying landing layer.

It is therefore an object of the invention to present a reactive pre-cleaning process whereby adhesion/barrier may be reliably deposited including retaining an adhesion to an underlying landing layer while overcoming other shortcomings and deficiencies in the prior art.

SUMMARY OF THE INVENTION

To achieve the foregoing and other objects, and in accordance with the purposes of the present invention, as embodied and broadly described herein, the present invention provides a method for forming an adhesion/barrier liner to improve adhesion and a specific contact resistance of semiconductor wafer metal interconnects.

In a first embodiment the method includes providing a semiconductor wafer having a process surface including an etched opening extending through a dielectric insulating layer thickness and in closed communication with a conductive underlayer surface; pre-heating the semiconductor wafer in a plasma reactor to a pre-heating temperature of at least 400° C.; cleaning the etched opening according to a plasma assisted reactive pre-cleaning process (RPC) comprising nitrogen trifluoride ($NF_3$); and, blanket depositing at least a first adhesion/barrier layer over the etched opening substantially free of fluorine containing residue.

These and other embodiments, aspects and features of the invention will become better understood from a detailed description of the preferred embodiments of the invention which are described in conjunction with the accompanying drawings.

DETAILED DESCRIPTION OF THE PREFERRED EMBODIMENTS

Although the method of the present invention is explained by exemplary reference to the formation of a tungsten filled via including a Ti/TiN adhesion barrier layer, it will be appreciated that the method of the present invention is equally applicable to the formation of other metal filled anisotropically etched openings, for example copper, aluminum and their alloys. In addition, the reactive pre-cleaning method of the present invention is applicable to the formation of other adhesion/barrier layers including tantalum, tantalum nitride, and silicided titanium nitride.

In a first embodiment of the present invention an anisotropically etched opening is provided in a semiconductor wafer process surface in closed communication with an underlying conductive surface. The process surface including the anisotropically etched opening is then subjected to a plasma assisted reactive pre-cleaning (RPC) process the plasma formed with a fluorine containing gas, preferably nitrogen trifluoride. The wafer temperature is pre-heated to a temperature sufficient to decompose surface adsorbed nitrogen trifluoride either during or subsequent to the RPC process to volatize the fluorine from the at least the underlying conductive surface and improve the adhesion of a subsequently deposited overlying adhesion/barrier layer.

Figure 1A:
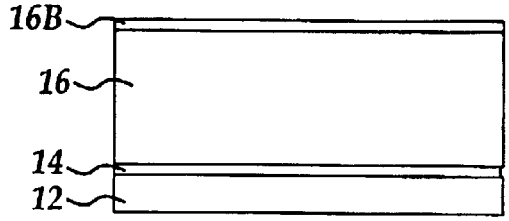
FIGS. 1A–1D are cross-sectional side views of a portion of an exemplary via semiconductor structure at processing stages in one embodiment of the method of the present invention.

The method according to the present invention is more clearly described by referring to FIGS. 1A–1D showing cross sectional side views of a portion of a multi-layered semiconductor wafer at stages in a manufacturing process to form a via. More specifically, in FIG. 1A is shown an underlying landing layer (conductive area) 12, for example a metal layer, for example, what is often referred to as a first metal layer or M1. It will be appreciated the underlying landing layer may be a semiconductor substrate. Overlying the landing layer 12 is formed an etching stop layer 14, for example silicon carbide or silicon nitride. The etching stop layer protects the underlying layer and provides selectivity contrast in a subsequent reactive ion etching process to form a via opening. The etching stop layer 14 is formed by a conventional chemical vapor deposition (CVD) process including for example, PECVD (plasma enhanced CVD), LPCVD (low pressure CVD), or HDPCVD (high density plasma CVD) having a thickness of about 200 Angstroms to about 1000 Angstroms.

Overlying the etching stop layer 14 is an insulating dielectric layer 16 often referred to as an inter-metal dielectric (IMD). For example, the insulating dielectric layer is formed of a silicon oxide material including carbon or fluorine doping to reduce a dielectric constant. Other materials may be used for the IMD layer including, for example, organo-silicate glass (OSG) and undoped silicate glass (USG). The insulating dielectric layer preferably has a dielectric constant of less that about 3.0 and is formed, for example, by a plasma enhanced chemical vapor deposition (CVD) process, for example PECVD or HDP-CVD. The dielectric insulating layer 16 is preferably formed to a thickness of between about 3000 and about 10,000 Angstroms. An anti-reflective coating (ARC) 16B, for example silicon oxynitride or silicon oxycarbide, also functioning as an etching stop layer, is deposited to reduce light reflections which can undesirably affect a subsequent photolithographic patterning process. The ARC layer 16B is formed over the IMD layer preferably by a conventional plasma enhanced CVD process, for example, LPCVD, to a thickness of about 200 Angstroms to about 800 Angstroms.

Figure 1B:
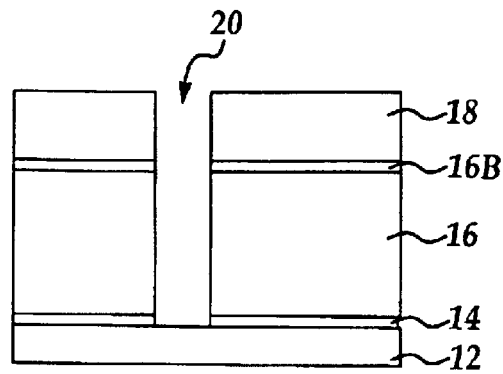

Referring to FIG. 1B, a conventional photolithographic patterning process is applied to photoresist layer 18, for example, a DUV photoresist active to light sources with wavelengths of, for example 193 nm and 248 nm. Following exposure and development to form a via etching pattern exposing the underlying ARC layer 16B, a conventional reactive ion etching (RIE) process using a fluorocarbon and hydrofluorocarbon etching chemistry, typically requiring a multi-step etching process, is then carried out to form via opening 20 by etching through the underlying layers including the IMD layer 16 and etching stop layer 14 to expose the conductive surface of the underlying landing layer 12. Following the RIE process, a plasma ashing process including an oxygen containing plasma is then carried out to strip the photoresist layer and substantially remove from the process surface and etched openings any residual organic residue remaining from the RIE process including, for example, fluorocarbon polymeric material.

In the method according to the present invention, a reactive pre-cleaning process (RPC) is carried out to clean the process surface including the via opening 20 and the surface of landing layer 12 using a fluorine containing plasma prior to deposition of an adhesion/barrier layer. The RPC process serves to remove residual organic material from the via opening 20 including native oxides formed over the exposed surface of landing layer 12. In addition, it is believed that the surface of the landing layer is 'nano-roughened', for example, including nanometer sized roughened areas thereby improving adhesion of a subsequently deposited adhesion/barrier layer. In one embodiment, a nitrogen trifluoride gas is supplied to a plasma forming reactor to form the fluorine containing plasma. In a preferred embodiment, the semiconductor wafer is preheated to a temperature of about 400° C. to about 700° C., for example about 550° C. to about 650° C. prior to carrying out the reactive pre-cleaning process. The pre-heating step is an essential feature of the invention since the preheating temperature allows dissociation of adsorbed nitrogen trifluoride and desorption of fluorine species during the cleaning process thereby reducing the amount of residually adsorbed species over the exposed landing layer. For example, it has been found that carrying out the reactive pre-cleaning step at lower temperatures results in poor adhesion of an overlying adhesion/barrier layer, for example a dual layer of Ti/TiN. It has been found that during a subsequent CMP process to remove excess tungsten following blanket deposition of tungsten to cover the adhesion/barrier layer and fill the via, that the lowermost Ti layer of the adhesion/barrier layer separates from the underlying landing layer, for example, copper or silicon. It is believed that the separation of the adhesion/barrier is caused by residual undissociated adsorbed nitrogen trifluoride or fluorine reacting with the lowermost Ti layer to reduce an adhesion bond strength and thereby unable to with stand the stresses induced by the subsequent CMP process.

In a preferred embodiment, the semiconductor substrate is subjected to a thermal annealing step following the reactive pre-cleaning step. Preferably, the thermal annealing process includes heating the substrate to temperatures of between about 400° C. to about 700° C. for a period of about 30 seconds to about 300 seconds. The thermal annealing process may be performed in-situ or in a rapid thermal annealing (RTA) apparatus as is known in the art. Preferably, the annealing step is carried out in-situ (in-vacuo) following the reactive pre-cleaning process to avoid a vacuum break exposing the process wafer to atmosphere and thereby forming native oxides over the landing layer surface (via opening bottom portion).

In another embodiment, following the reactive pre-cleaning process a titanium layer of the Ti/TiN adhesion/barrier layer is deposited according to a PVD process preceded by a wafer preheating step to a temperature of about 400° C. to about 700° C., more preferably about 550° C. to about 650° C. In a preferred embodiment the Ti layer is blanket deposited over the landing layer 12 by ion metal plasma IMP).

In a more preferred embodiment, following the thermal annealing step the titanium layer of the Ti/TiN adhesion/barrier layer is deposited according to a PVD process, preferably IMP, by carrying out the PVD deposition process at a wafer temperature of about 400° C. to about 700° C., for example about 550° C. to about 650° C. Preferably, the wafer is subjected to a pre-heating step prior to the deposition process. Subjecting the process wafer to both a thermal annealing treatment and carrying out the PVD deposition at the preferred temperatures, dissociation and substantial desorption of adsorbed fluorine containing compounds, for example, nitrogen trifluoride is assured. By the term 'substantial' is meant greater than about 90 percent. In addition, it is believed the high temperature PVD deposition of the Ti layer improves titanium atom deposition by increasing titanium atom surface mobility to thereby improve adhesion to the underlying landing underlayer.

In an exemplary embodiment, reactive pre-cleaning plasma conditions include an RF power supplied at a power of about 100 to about 500 Watts with an optionally applied bias power of about 100 to about 300 Watts. Preferably, the reactive pre-cleaning process is carried out at pressures from about 1 milliTorr to about 100 milliTorr, more preferably, about 1 milliTorr to about 50 milliTorr. A fluorine containing gas, preferably nitrogen trifluoride, is supplied to make up a reactive gas concentration of about 1 percent to about 50 percent by volume of nitrogen trifluoride with the remaining portion made up of one or more inert gases such as argon, helium, and nitrogen. For example, the nitrogen trifluoride is supplied at a rate of about 50 sccm to about 300 sccm. The reactive pre-cleaning treatment is carried out for about 10 seconds to about 120 seconds.

Figure 1C:
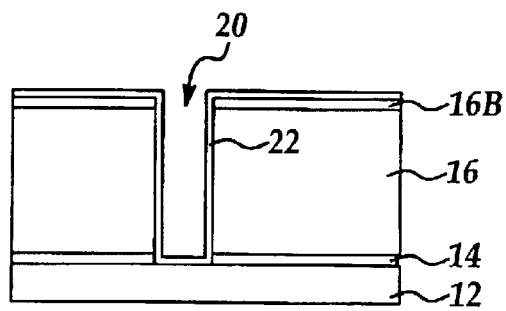

Referring to FIG. 1C, following blanket deposition of the Ti layer (not shown) preferably according to an IMP PVD deposition process, a conventional CVD process is carried to form a TiN layer over the Ti layer to complete the formation of the Ti/TiN adhesion barrier layer 22. The Ti layer is preferably formed having a thickness of about 2 nm to about 50 nm and the TiN layer preferably formed having a thickness of about 2 nm to about 50 nm.

In another exemplary embodiment, the adhesion/barrier layer is formed of silicided titanium nitride (e.g., TiSiN) with the preferred embodiments for the reactive pre-cleaning process including an optional thermal annealing step precedes CVD deposition of TiN followed by silicidation with silane.

The preferable CVD method for depositing the TiN layer is a low temperature method using metal-organic TiN precursors such as TDEAT (tetrakis diethylamino titanium, $Ti(N(CH_2CH_3)_2)_4$), or TDMAT (tetrakis dimethylamino titanium, $Ti(N(CH_3)_2)_4$), to form a MOCVD-metal nitride film. The low temperature process, for example, within a range of about 250° C. to about 450° C., is preferable if the metal contact underlayer is a low melting point metal such as Cu. Another reason is that the titanium nitride (e.g., TiN) adhesion/barrier layer will preferably remain amorphous thereby providing even greater resistance to metal diffusion.

For example, in a preferred titanium nitride CVD deposition process, for example, an LPCVD process, the titanium nitride layer is deposited according to a plasma enhanced deposition at a pressure of about 1 milliTorr to about 10 milliTorr using an inert carrier gas, such as argon, to carry the TiN precursor at a flow rate of between about 100 and 200 sccm. A nitrogen precursor is introduced at between about 1 and 50 sccm to controllably vary the relative amount of nitrogen within the conducting diffusion barrier to form a titanium nitride layer having a formula $Ti_xN_{(x-1)}$.

Figure 1D:
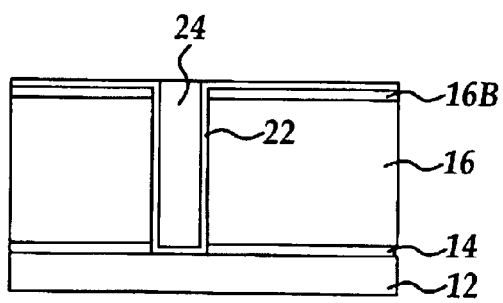

Referring to FIG. 1D, in an exemplary embodiment, following deposition of the Ti/TiN adhesion/barrier, tungsten metal is blanket deposited by a CVD process using, for example, a $WF_6$ precursor, to form tungsten via filling layer 24. For example, a plasma enhanced CVD deposition using a PECVD or HDP-CVD method is preferably used to blanket deposit the tungsten layer 24. Following tungsten layer deposition a planarization process including a CMP process is carried out to remove excess tungsten and a portion of the adhesion/barrier layer 22 overlying the IMD layer above the via level. It will be appreciated that the CMP process may be used together with a tungsten dry etchback process.

Figure 2:
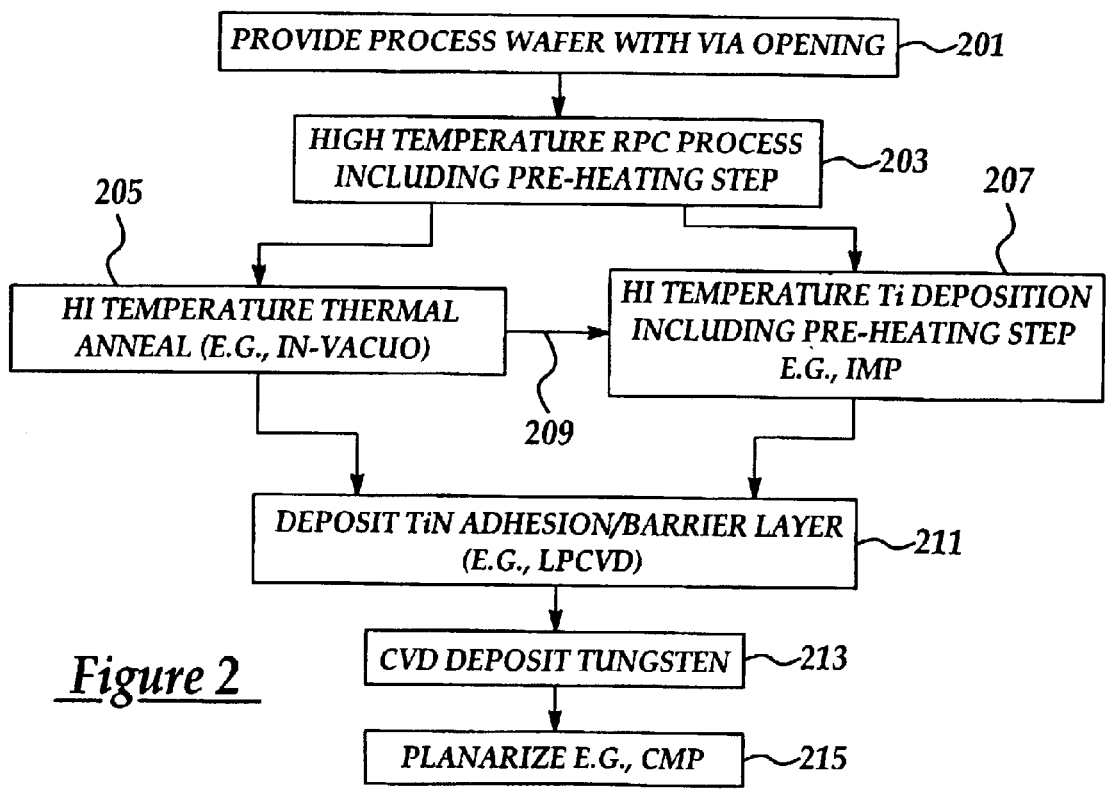
FIG. 2 is a process flow diagram including several embodiments of the present invention.

Referring to FIG. 2 is shown an exemplary process flow diagram including several embodiments of the present invention. In process 201 a semiconductor process wafer is provided having an IMD layer including via openings in closed communication with respective underlying conductive areas. In process 203 a plasma assisted reactive pre-cleaning (RPC) process including a fluorine containing gas, preferably nitrogen trifluoride ($NF_3$), is preceded by a wafer pre-heating process to a temperature sufficient to dissociate nitrogen trifluoride and at least partially volatize residual fluorine. In process 205 a high temperature thermal annealing treatment, preferably in-vacuo, is carried out to volatize residual adsorbed fluorine containing compounds prior to PVD (e.g., IMP) deposition of Ti. In alternative process 207, a high temperature Ti PVD deposition process, preferably IMP deposition, is carried out at a temperature sufficient to simultaneously volatize (desorb) adsorbed fluorine containing compounds and improve Ti adhesion. As indicated by direction process arrow 209, optionally, both the annealing process and the high temperature IMP Ti deposition are carried out following RPC process 203. In process 211, a titanium nitride layer is deposited according to a plasma assisted CVD process. In process 213, a tungsten CVD process is used to blanket deposit tungsten to fill the via opening. In process 215, a CMP process is used to planarize the surface above the via opening level.

Thus, a method has been presented including a reactive pre-cleaning process whereby adhesion/barrier may be reliably deposited including retaining an adhesion to an underlying landing layer. For example in exemplary embodiments of the invention, the incidence of titanium layer separation from the underlying landing area has been eliminated. In addition, a specific contact resistance of the tungsten filled via, formed according to the preferred RPC methods of the present invention, measured by conventional methods has been found to be reduced by about 25% to about 33% compared to prior art methods of depositing adhesion/barrier layers.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming an adhesion/barrier liner with reduced fluorine contamination to improve adhesion and a specific contact resistance of metal interconnects comprising the steps of:
   providing a semiconductor wafer having a process surface including an etched opening extending through a dielectric insulating layer thickness and in closed communication with a conductive underlayer surface;
   pre-heating the semiconductor wafer in a plasma reactor to a pre-heating temperature of at least 400° C.;
   cleaning the etched opening according to a plasma assisted reactive pre-cleaning process (RPC) comprising nitrogen trifluoride ($NF_3$);
   annealing the semiconductor wafer at a temperature of from about 400° C. to about 700° C.; and,
   blanket depositing at least a first adhesion/barrier layer over the etched opening substantially free of fluorine containing residue.

2. The method of claim 1, wherein the pre-heating temperature is from about 550° C. to about 650° C.

3. The method of claim 1, wherein the step of annealing is carried out in-situ following the cleaning step.

4. The method of claim 1, wherein the step of blanket depositing is carried out at a temperature of from about 550° C. to about 700° C. following the step of cleaning.

5. The method of claim 1, wherein the step of blanket depositing is carried out in-situ following the step of annealing.

6. The method of claim 1, wherein the adhesion/barrier layer comprises a first layer of titanium and a second layer of titanium nitride.

7. The method of claim 1, wherein the etched opening comprises a via opening.

8. The method of claim 1, further comprising the step of blanket depositing a metal layer selected from the group consisting of tungsten, copper, aluminum, and alloys thereof over the adhesion/barrier layer to fill the etched opening.

9. The method of claim 1, wherein the adhesion/barrier layer comprises at least one layer selected from the group consisting of titanium, titanium nitride, tantalum, tantalum nitride, and silicided titanium nitride.

10. The method of claim 1, wherein the plasma assisted reactive pre-cleaning process consists essentially of nitrogen trifluoride and one or more inert gases.

11. The method of claim 1, wherein the semiconductor wafer process surface in provided free of an overlying resist layer.

12. The method of claim 1, wherein the step of blanket depositing comprises an ion metal plasma (IMP) process.

13. A method for forming a titanium/titanium nitride adhesion/barrier liner in a metal interconnect to improve adhesion and specific contact resistance comprising the steps of:
   lithographically patterning a semiconductor wafer process surface comprising a resist layer overlying a dielectric insulating layer for etching an opening;
   etching an opening extending through a dielectric insulating layer thickness portion in closed communication with a conductive underlayer surface;
   removing the resist layer;
   cleaning the opening according to a plasma assisted reactive pre-cleaning process (RPC) comprising nitrogen trifluoride gas at a temperature of greater than about 550° C.; and,
   annealing the semiconductor wafer at a temperature of about 400° C. to about 700° C.; and
   blanket depositing a titanium/titanium nitride layer.

14. The method of claim 13, wherein the step of blanket depositing is carried out at a temperature of about 550° C. to about 700° C. following the step of cleaning.

15. The method of claim 13, further comprising the step of blanket depositing a metal selected from the group consisting of tungsten, copper, aluminum, and alloys thereof over the adhesion/barrier layer to fill the opening.

16. The method of claim 13, wherein the plasma assisted reactive pre-cleaning process consists essentially of nitrogen trifluoride and one or more inert gases.

17. The method of claim 13, wherein the steps of cleaning and blanket depositing are carried out in-situ.

* * * * *